United States Patent
Doh et al.

(10) Patent No.: US 6,911,644 B2
(45) Date of Patent: Jun. 28, 2005

(54) AUTOMATIC GAIN CONTROL DEVICE FOR A BURST-MODE OPTICAL RECEIVER

(75) Inventors: Hee-Chan Doh, Suwon-shi (KR); Gil-Yong Park, Suwon-shi (KR); Shin-Hee Won, Seoul (KR); Yun-Je Oh, Yongin-shi (KR); Tae-Sung Park, Suwon-shi (KR); Hyeon-Cheol Ki, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 283 days.

(21) Appl. No.: 10/389,058

(22) Filed: Mar. 14, 2003

(65) Prior Publication Data

US 2003/0201382 A1 Oct. 30, 2003

(30) Foreign Application Priority Data

Apr. 26, 2002 (KR) ................................. 10-2002-0023065

(51) Int. Cl.[7] ............................................... H01L 31/00
(52) U.S. Cl. .................................. 250/214 AG; 330/59
(58) Field of Search ...................... 250/214 AG, 214 A; 330/59, 75, 129, 254, 278, 308; 327/514; 375/316, 345

(56) References Cited

U.S. PATENT DOCUMENTS

| | | | | | |
|---|---|---|---|---|---|
| 5,430,766 | A | * | 7/1995 | Ota et al. | 375/345 |
| 5,574,714 | A | * | 11/1996 | Masashi et al. | 330/254 |
| 5,955,921 | A | * | 9/1999 | Ide et al. | 330/254 |
| 6,504,429 | B2 | * | 1/2003 | Kobayashi | 330/85 |
| 6,587,004 | B2 | * | 7/2003 | Ide | 330/308 |
| 6,597,245 | B2 | * | 7/2003 | Yamazaki | 330/308 |
| 6,608,710 | B1 | * | 8/2003 | Battagin | 250/214 A |
| 2002/0153958 | A1 | | 10/2002 | Ide | |

FOREIGN PATENT DOCUMENTS

| | | | |
|---|---|---|---|
| EP | 1006653 | 6/2000 | H03K/5/08 |
| WO | WO0148914 | 7/2001 | H03F/3/08 |

* cited by examiner

Primary Examiner—Thanh X. Luu
Assistant Examiner—Seung C. Sohn
(74) Attorney, Agent, or Firm—Cha & Reiter, L.L.C.

(57) ABSTRACT

An automatic-gain-control device in an optical receiver is provided and includes a pre-amplifier for converting a current signal outputted from an optical detector to a voltage signal and a bottom level detector for detecting the bottom level from the output of the pre-amplifier, the automatic-gain-control device comprising a bottom signal-level-determining section for analyzing the bottom level from the bottom level detector and outputting a signal denoting the presence of a signal and a reset signal for initialization at intervals between packets; and an automatic-gain-control signal generating section for providing an automatic-gain-control signal by showing the presence of a signal, the automatic-gain-control-signal-generating section including a first transistor which turns on according to a signal from the bottom signal-level-determining section and a second transistor which is connected to a capacitor for charging or discharging a voltage applied by the first transistor, and the drain voltage of which becomes low when the capacitor is charged but becomes high when the capacitor is discharged.

7 Claims, 9 Drawing Sheets

(PRIOR ART)

AUTOMATIC GAIN CONTROL DEVICE FOR A BURST-MODE OPTICAL RECEIVER

CLAIM OF PRIORITY

This application claims priority to an application entitled "Automated Gain Control Device For a Burst-Mode Optical Receiver," field in the Korean Intellectual Property Office on Apr. 26, 2002 and assigned Serial No. 2002-23065, the contents of which are hereby incorporated by reference.

BACKGROUND OF THE INVENTION

1. Field of the Invention

The present invention relates to a burst-mode optical receiver and more particularly to a burst-mode optical receiver that can determine an input signal and generate on its own a reset signal for initialization during intervals between the packets.

2. Description of the Related Art

The next generation of communication services require FTTH (Fiber-To-The Home), which installs optical fiber directly into subscribers' homes in order to provide more information to the subscribers at a higher speed. However, it is costly to replace existing copper-based subscriber lines with optical subscriber lines, such as FTTH. In this regard, PONs (Passive Optical Networks) have been proposed for the provision of low-cost optical subscriber lines.

Figure 1:
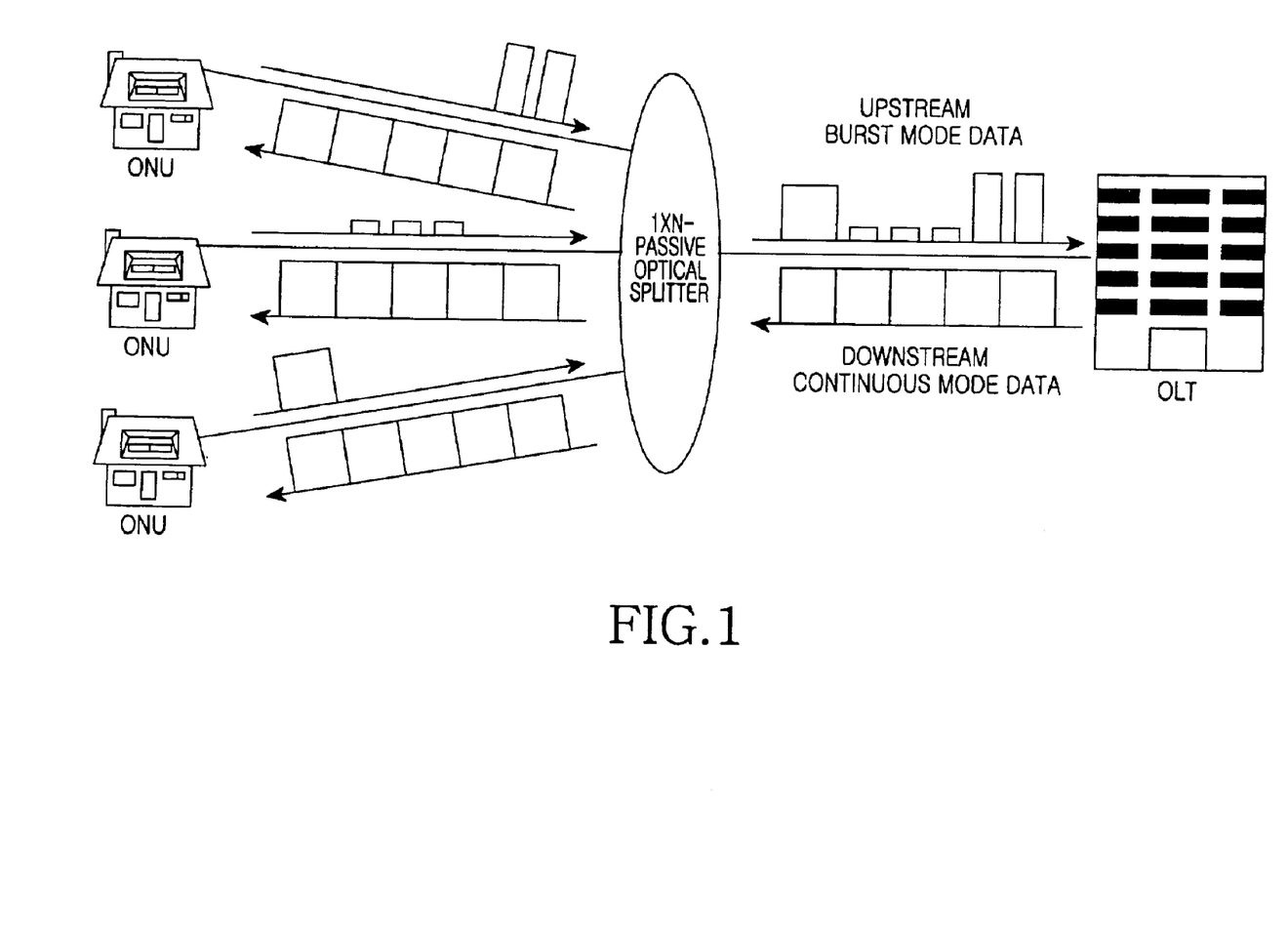
FIG. 1 illustrates a passive optical network system.

FIG. 1 illustrates a passive optical network system which consists of mainly an optical line termination (OLT) located in a central office, a plurality of 1×N passive optical splitter, and a plurality of optical network units (ONUs) located in the subscriber's premise. In operation, each node transmits data or packets to another node using a predetermined time slot. It is possible for multiple subscribers to transmit data via a single-fiber optic strand through a time-division multiplexing scheme, so that the receiver (OLT) can receive data from each subscriber at any time. Note that the multi-access network is different from a point-to-point link in that it tends to generate a burst-mode data of varying sizes and phases from received data packets due to the optical loss, which occurs via different transmission paths. Further, the size of data packets received tend to vary due to the difference in the path lengths to the subscribers' premises.

Accordingly, the current trend is to use a burst-mode optical receiver capable of receiving data of various sizes and phases and then to restore the data to the same size and phase for all packets. The burst-mode optical receiver extracts a detection threshold as a reference signal for data determination from each burst packet received. The burst-mode optical receiver must have a function of restoring data by amplifying the data symmetrically based on the extracted detection threshold.

Furthermore, in the burst-mode optical receiver, a pre-amplifier together with an optical detector form a front-end of the optical receiver, such that the pre-amplifier can convert an input optical signal to an electrical signal and then amplify the signal with a minimum level of noise. As the pre-amplifier significantly affects the overall receiving sensitivity of the optical receiver and the receiving signal range, it is required to have high gain, broad bandwidth, and low-level noise characteristics. Therefore, the pre-amplifier must have a sufficiently low level of noise kept at a low BER, while ensuring a sufficient output voltage for a low input current. For a high input current, the noise must be low enough to avoid a pulse-width distortion. Accordingly, the pre-amplifier of the burst-mode optical receiver is able to detect the amplitude fluctuations of a signal inputted to an amplifier and automatically control the gain utilizing an automatic gain controller, thereby maintaining the amplitude of an output signal at a constant level.

BiCMOS processes can easily embody an automatic-gain-control (AGC) device, which reduces the effective gain for a larger input signal, thereby improving the overload characteristic. This is mainly in part that in BiCMOS processes, a bipolar junction transistor (BJT) can be used in an amplified segment requiring a high-speed characteristic, and a CMOS element can be used as an active variable resistor that is adjustable by a voltage. The automatic-gain-control device uses the direct current part of an output as a control voltage in order to maintain the gain to be constant. The most commonly used construction feeds back a part of the output voltage to a pre-amplifier in order to control the gain.

The automatic-gain-control device must operate rapidly and respond to be used in a burst-mode operation. The loop time of currently commercially-available automatic gain controllers is typically about 5 $\mu$sec; however, to be used in a burst-mode operation, automatic gain controllers must respond more rapidly within tens of nano seconds at the longest.

Figure 2:
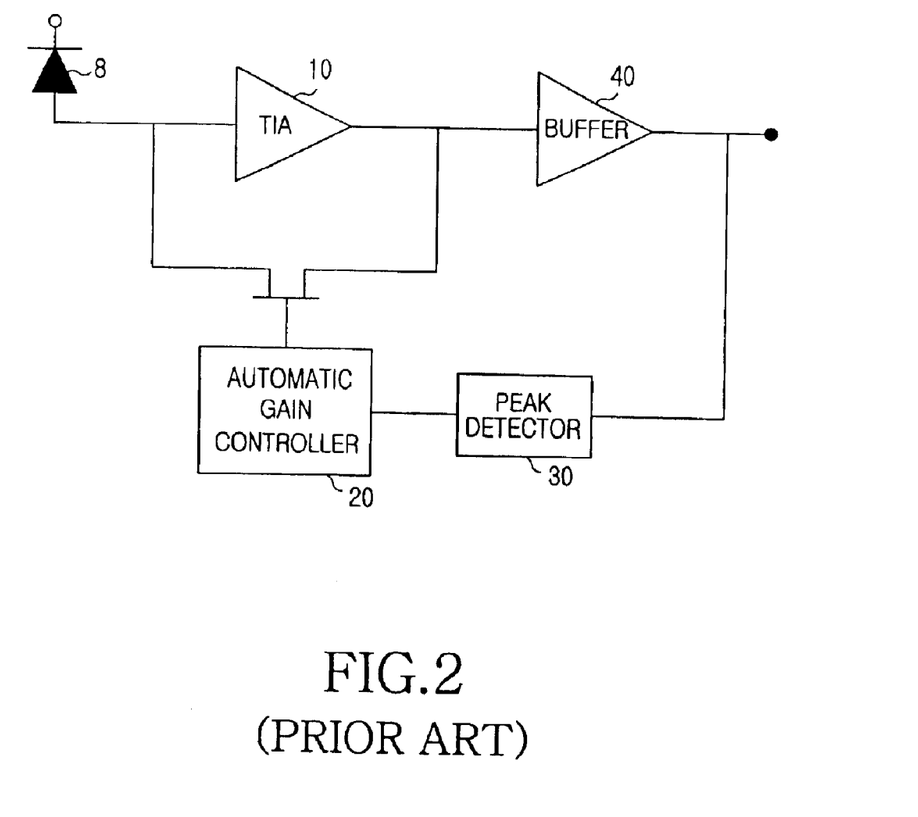
FIG. 2 shows the construction of a burst-mode optical receiver comprising a general automatic gain controller.

FIG. 2 illustrates the construction of a burst-mode optical receiver comprising a conventional automatic gain controller. As shown, the burst-mode optical receiver comprises an optical detector 8, a pre-amplifier 10, an automatic gain controller 20, a peak detector 30, and a buffer 40.

The optical detector 8 is configured to convert an input optical signal to a current signal. The pre-amplifier (or trans-impedance amplifier; hereinafter referred to as "TIA") 10 converts the current signal detected at the optical detector 8 and outputs a corresponding signal to the buffer 40. The peak detector 30 detects a peak value which is the highest level of the signal outputted from the buffer 40, then outputs the peak value to the automatic gain controller 20. The automatic gain controller 20 receives the output from the peak detector 30 and the TIA 10 and generates an AGC signal, which is forwarded to the TIA 10. The peak detector 30 has a hold capacitor therein. When charged, the hold capacitor memorizes an initial AGC signal and continuously maintains the voltage level. Thus, when the hold capacitor is discharged, the AGC signal is terminated.

The automatic gain controller of the prior art as mentioned above can detect a peak value of a high-level signal without difficulty. However, this automatic gain controller has a problem in determining the presence of a low-level signal because it is difficult for the controller to correctly determine the actual voltage-level information only through detecting the peak value of a low-level signal.

SUMMARY OF THE INVENTION

Accordingly, the present invention has been made to solve the above-mentioned problems occurring in the prior art and provides additional advantages, by providing a burst-mode optical receiver capable of determining an input signal and generating an initial reset-signal on its own.

One aspect of the present invention is to provide an automatic-gain-control device, which can rapidly respond between the packets during a burst-mode operation and determine the presence of a signal correctly, and which can greatly reduce AGC loop time (to tens of nsec at the longest).

One embodiment of the present invention provides an automatic-gain-control device in an optical receiver which includes a pre-amplifier for converting a current signal outputted from an optical detector to a voltage signal and a bottom-level detector for detecting the bottom level from the output of the pre-amplifier. The automatic-gain-control device comprising: a bottom signal-level-determining section for analyzing the bottom level detected at said bottom-level detector and outputting a signal denoting the presence of a signal and a reset signal for initialization at intervals between packets; and an automatic-gain-control signal generating section for providing an automatic-gain-control signal by showing the presence of a signal. The automatic-gain-control signal generating section includes a first transistor which turns on according to a signal from the bottom signal-level determining section and a second transistor which is connected to a capacitor for charging or discharging a voltage applied by the first transistor, and the drain voltage of which becomes low when the capacitor is charged but becomes high when the capacitor is discharged.

BRIEF DESCRIPTION OF THE DRAWINGS

The above features and advantages of the present invention will be more apparent from the following detailed description taken in conjunction with the accompanying drawings, in which.

DETAILED DESCRIPTION OF THE PREFERRED EMBODIMENT

Hereinafter, a preferred embodiment of the present invention will be described with reference to the accompanying drawings. For the purposes of clarity and simplicity, a detailed description of known functions and configurations incorporated herein will be omitted as it may make the subject matter of the present invention unclear.

Figure 3:
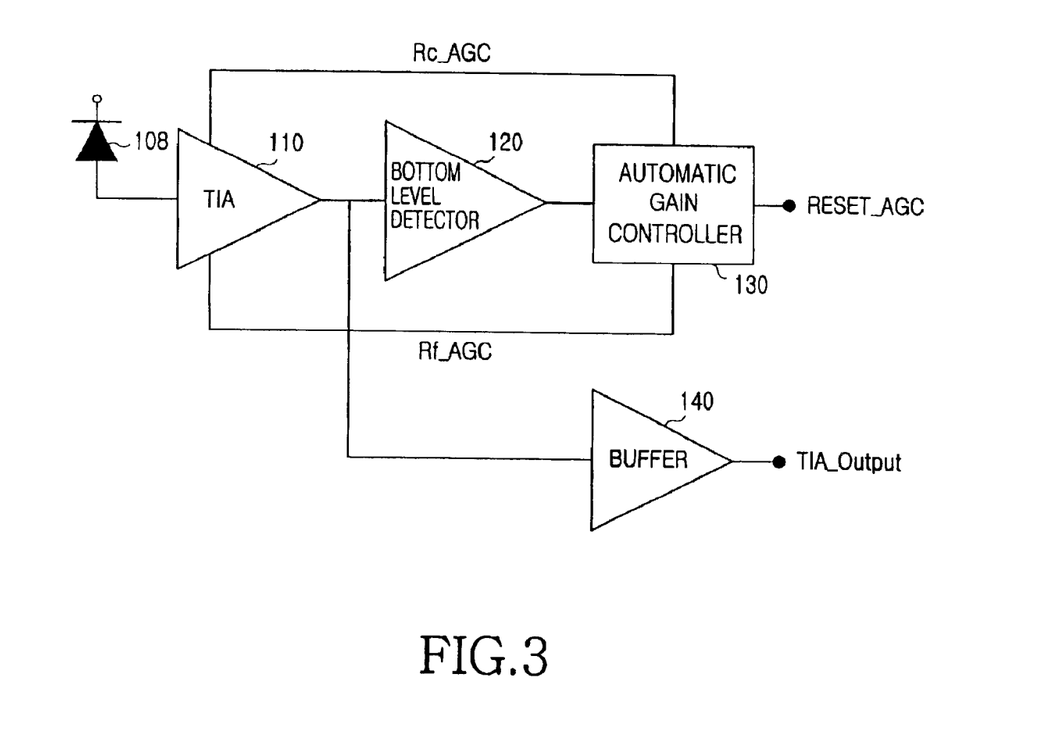
FIG. 3 shows the construction of a burst-mode optical receiver according to an embodiment of the present invention.

FIG. 3 shows the construction of a burst-mode optical receiver according to the embodiment of the present invention. As shown, the burst-mode optical receiver comprises an optical detector 108, a trans-impedance amplifier (TIA) 110, a bottom signal-level detector 120, an automatic gain controller 130, and a buffer 140.

In operation, the TIA 110 converts a current signal outputted from the optical detector 108 to a corresponding voltage signal, then provides the voltage signal to the bottom level detector 120. The bottom level detector 120 detects the bottom level of the signal output from the TIA 110 and informs the presence of a signal and the intervals of packets. The automatic gain controller (AGC) 130 generates an AGC signal based on the bottom signal level provided from the bottom level detector 120 and automatically controls the gain. At the same time, the AGC 130 generates a reset signal for initialization at intervals between packets in response to the bottom level. The buffer 140 is provided for the safety of the circuit and the adjustment of the voltage level.

Figure 4:
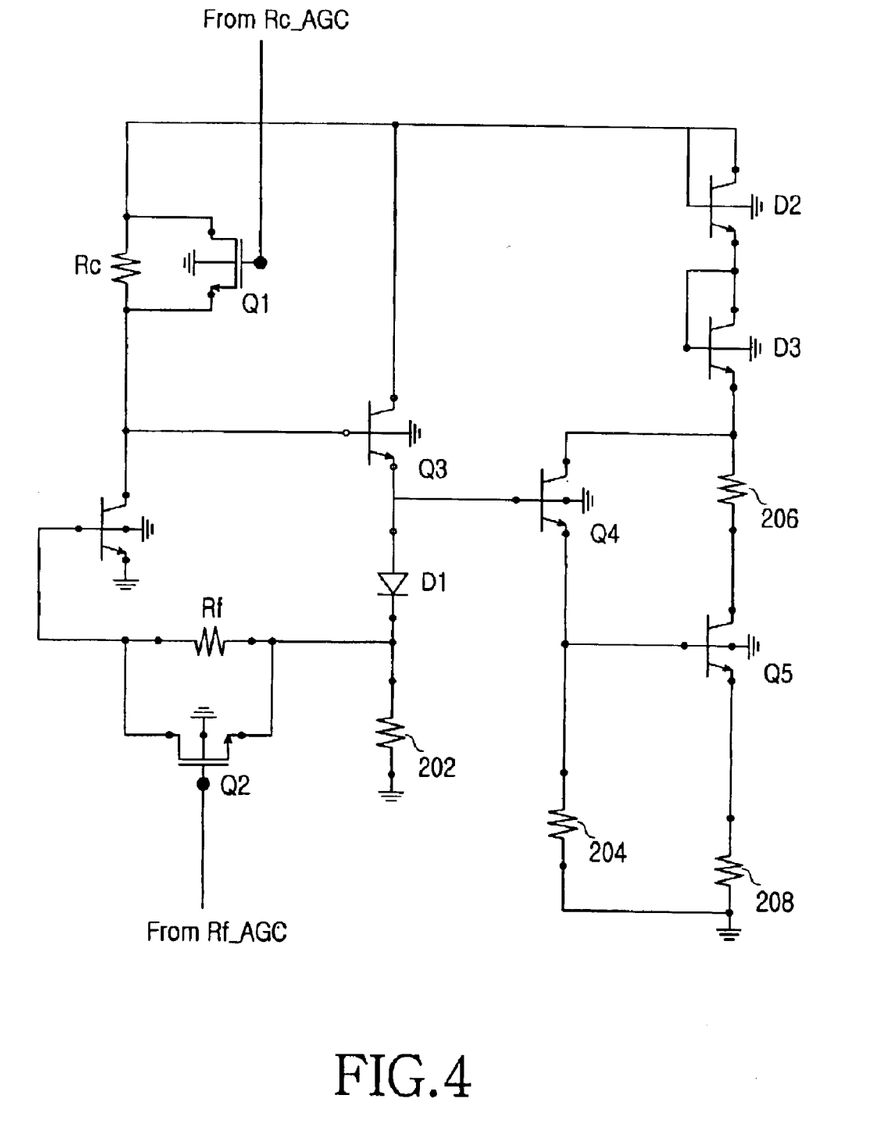
FIG. 4 is a circuit diagram of a TIA according to an embodiment of the present invention.

FIG. 4 is a circuit diagram of the TIA according to the embodiment of the present invention. As shown, the TIA 110 inputs an AGC signal which has been outputted from AGC 130 via transistors Q1 and Q2. Both ends of each of the transistors Q1 and Q2 are connected to resistors Rc and Rf, respectively. The bandwidth and trans-impedance gain of the TIA are determined by the resistors Rc and Rf, as explained further with reference to FIG. 6.

Figure 5:
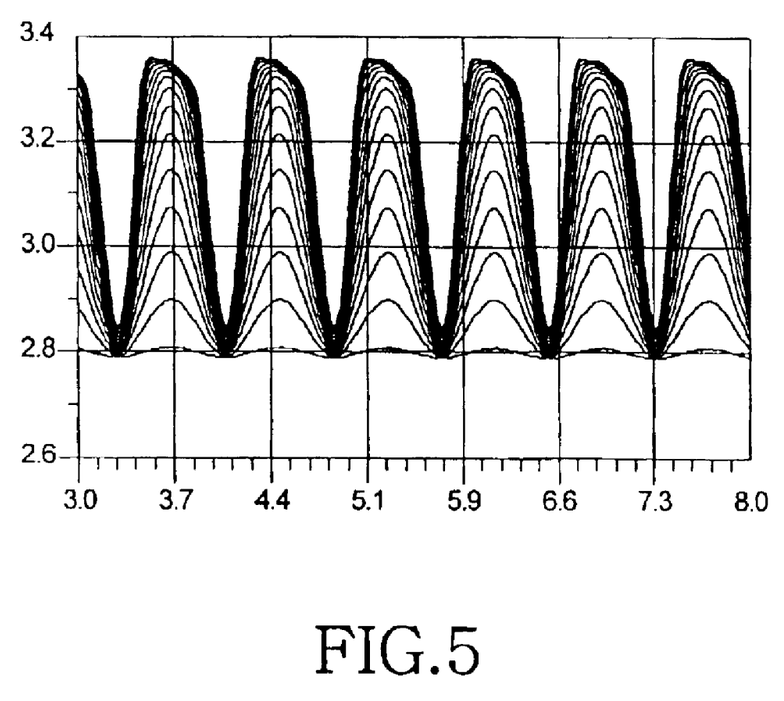
FIG. 5 shows the output characteristic of an input current in the TIA when an automatic gain controller does not operate.

FIG. 5 shows a wave of the output characteristic of an input current in TIA when AGC is not operating. As shown, when the AGC 130 does not operate, a considerable output signal distortion occurs if the level of an input current is beyond the range of −31 dBm to −16 dBm. As such, the AGC 130 must operate in order to prevent the signal distortion. Note that the AGC 130 must have a waveform which is not distorted regardless of the current input.

Figure 6:
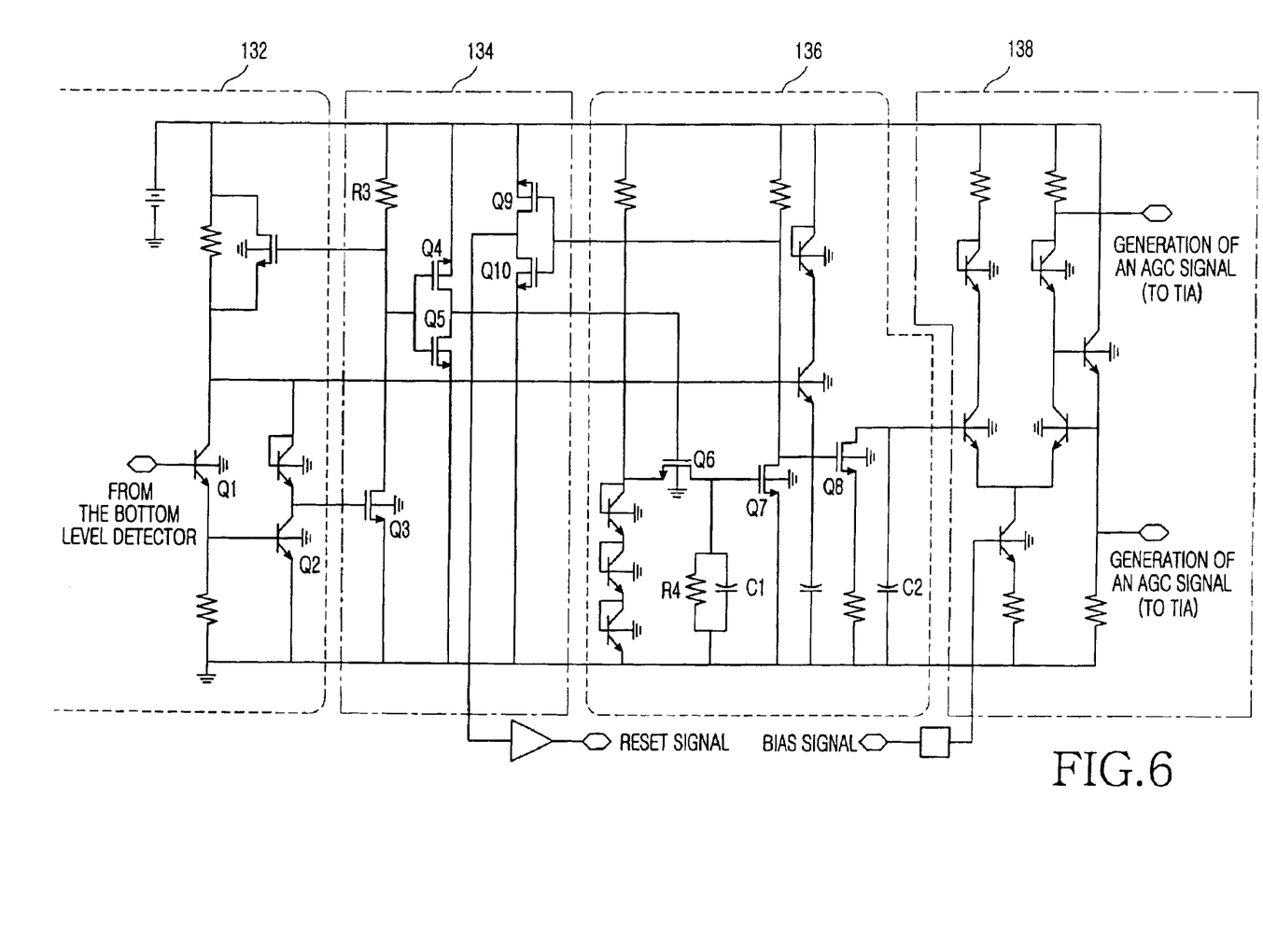
FIG. 6 is a circuit diagram of an automatic gain controller according to an embodiment of the present invention.

FIG. 6 is a circuit diagram of the automatic gain controller according to the embodiment of the present invention.

As shown in FIG. 6, the AGC 130 detects the level of an output signal and generates an AGC signal, thereby changing the amounts of Rf and Rc according to the amount of an input current. The generated AGC signal is applied to the transistors Q1 and Q2 of the TIA 110. I–V DC characteristic curve of MOS is utilized. As Rf and Rc values vary depending on the amount of Vgs (gate-source voltage) applied to the gates of the transistors Q1 and Q2, the bandwidth and gain at a desired input current can be determined selectively. The following formulae 1, 2, and 3 are used to obtain an Rf value.

[Formula 1]

$$Rf = Vd/Id$$

[Formula 2]

$$Id = (W/L)\mu_n Ci(Vgs-Vt)Vd, \text{ for } Vd \ll Vgs-Vt$$

[Formula 3]

$$Rf = (L/W)[\mu_n Ci(Vgs-Vt)Vd]$$

In formulae 2 and 3, Vt refers to a threshold voltage, $\mu$ and n refer to electron mobility, Ci refers to a capacitance per unit area, W refers to a channel width, and L refers to a channel length.

As shown in the above equations, Rf and Rc values vary depending on the amount of Vgs applied to the gate.

Referring back to FIG. 6, the AGC 130 according to the present invention generates an AGC signal when the transistors Q1 and Q2 are turned off by the bottom signal-level output from the TIA. Note that a signal begins to be distorted at its bottom signal level during the amplification by the TIA 110. In the embodiment, the AGC 130 begins to operate when an output signal from the TIA 110 begins to be distorted, then the AGC 130 compensates the gain characteristic according to the level of an input signal. As shown in FIG. 6, the AGC 130 comprises a bottom signal level-determining section 134, an AGC signal-generating section 136, and an output-stabilizing buffer 138.

The bottom signal-level-determining section 134 consists of a resistor R3 and transistors Q3, Q4, and Q5 and serves to analyzes the bottom level of a signal inputted to the base of the transistor Q1 and determines whether a signal is present. If it is determined that a signal is present, the bottom signal-level-determining section 134 will output a "high" signal. If it is determined that no signal is present, the bottom signal-level-determining section 134 will generate a reset signal for initialization at intervals between packets.

The output of the bottom signal-level-determining section 134 is connected to the gate of a transistor Q6 of the AGC signal generating section 136. The transistor Q6 turns on when its gate voltage is maintained to be high. As shown in FIG. 6, when the transistor Q6 turns on, a capacitor C1 connected to the drain of the transistor Q6 is charged to have a voltage of 3 times greater than the diode turn-on voltage. At this time, the drain voltage of a transistor Q7 becomes "low" to show the presence of a signal.

On the other hand, if the bottom signal-level-determining section 134 determines that no signal is present, it will turn the gate voltage of the transistor Q6 of the AGC-signal-generating section 136 to be "low." When the gate voltage is low, the transistor Q6 turns off and begins to be discharged at a voltage of 3 times greater than the diode turn-on voltage. The transistor Q6 is kept turned off until the discharge time set by an internal time constant circuit, which is formed by the capacitor C1 and the resistor R4, lapses. Then, the drain voltage of the transistor Q7 becomes "high" to show that no signal is present, which indicates the end of a packet. This indication causes a transistor Q8 to be discharged and an AGC signal to be reset so that the AGC voltage level can be reset at the beginning of the next packet. Accordingly, it is possible to prevent problems, such as excessive reduction of the TIA's output when the AGC-operation-standard level is excessively lowered or the operation of the AGC after distortion of an output signal when the standard level is excessively raised.

Figure 7A:
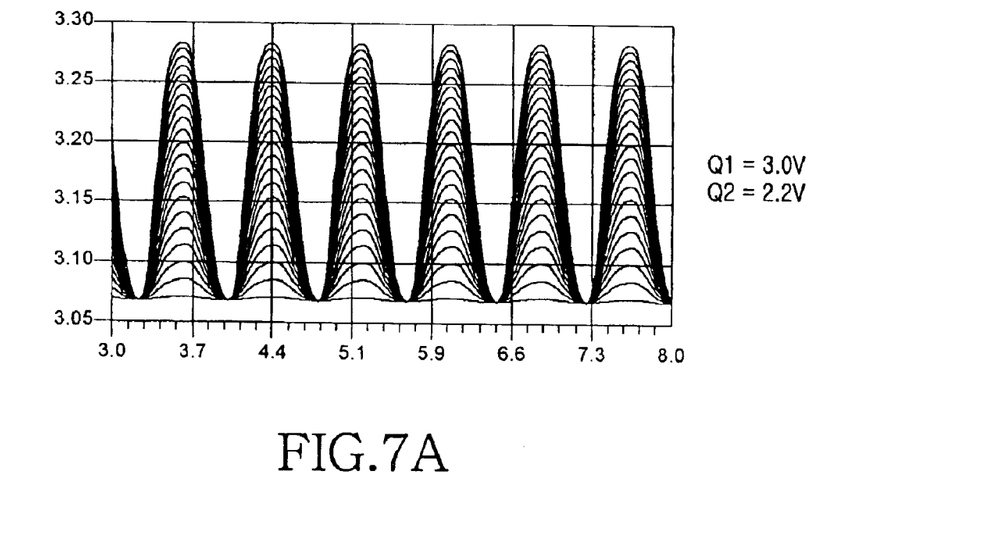
FIGS. 7a and 7b show the output-voltage characteristic according to the amount of an input current in the TIA when an automatic gain controller generates an automatic-gain-control signal that is not distorted.
Figure 7B:
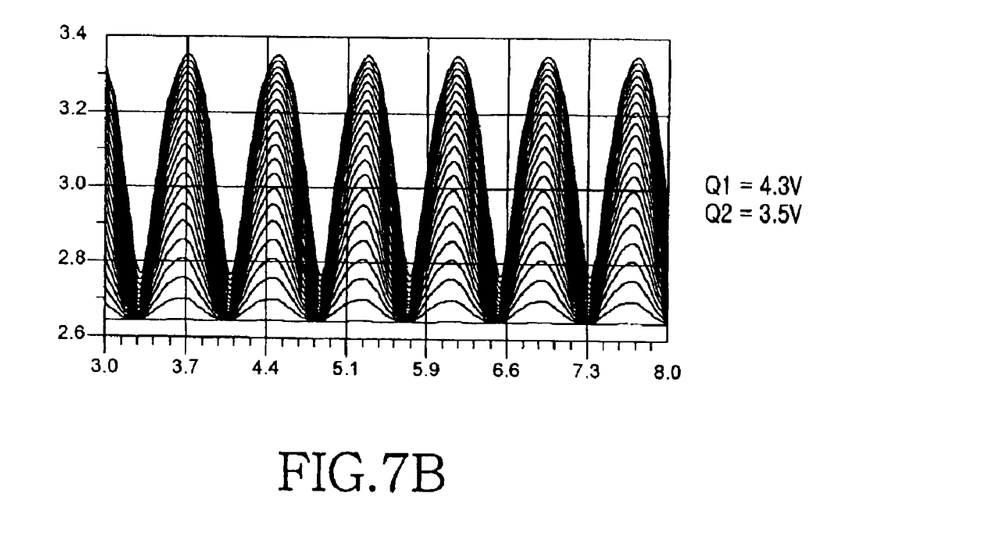

FIGS. 7a and 7b show the output-voltage characteristic according to the amount of an input current in the TIA when the automatic gain controller generates an automatic-gain-control signal to adjust the signal distortion. In particular, FIG. 7a shows the output voltage characteristic when applying 3.0V to the gate of the transistor Q1 and 2.2V to the gate of the transistor Q2 when the level of an input current is −31 dBm to −11 dBm. FIG. 7b shows the output-voltage characteristic when applying 4.3V to the gate of the transistor Q1 and 3.5V to the gate of the transistor Q2 when the level of an input current is −31 dBm to 0 dBm. As shown in FIGS. 7a and 7b, the TIA 110 generates an output voltage that is not distorted according to the AGC signal.

Figure 8:
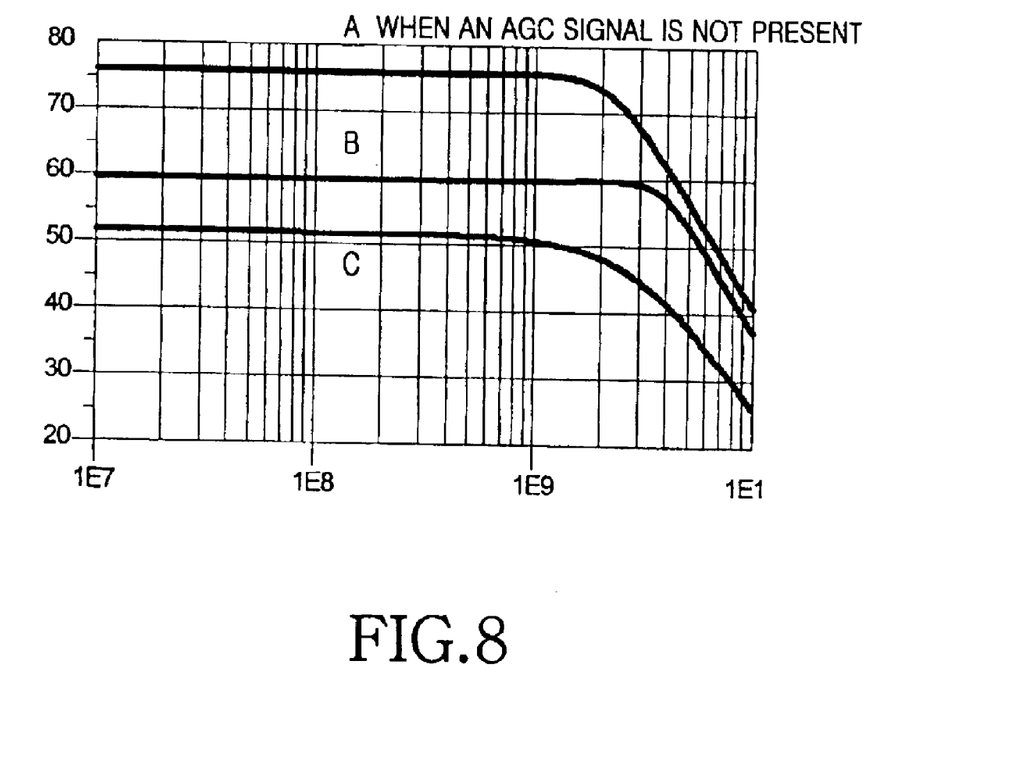
FIG. 8 shows the gain and bandwidth characteristics of the TIA when an AGC signal is generated.

FIG. 8 shows the gain and bandwidth characteristics of the TIA when an AGC signal is generated. Curve "A" in FIG. 8 shows the gain and bandwidth characteristics of the TIA when an AGC signal is not generated. Curves "B" and "C" show the gain and bandwidth characteristics of the TIA in the cases shown in FIGS. 7a and 7b, respectively.

As described earlier, the AGC 130 operates when an output signal begins to be distorted during the amplification by the TIA 110. Accordingly, it is possible to prevent problems, such as excessive reduction of the TIA's output when the AGC operation standard level is excessively lowered, or operation of the AGC after the distortion of the output signal when the standard level is excessively raised.

Figure 9A:
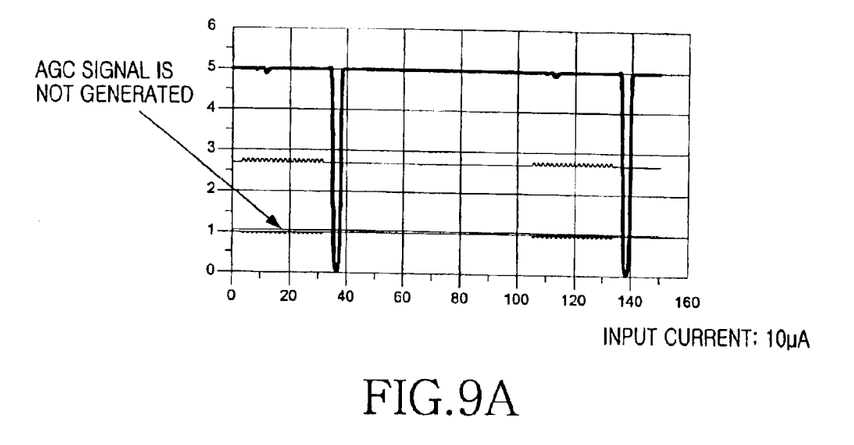
FIGS. 9a and 9b show that an AGC signal is not generated at a low-level input current, and that an AGC signal is generated when the input current is raised to a sufficient level.
Figure 9B:
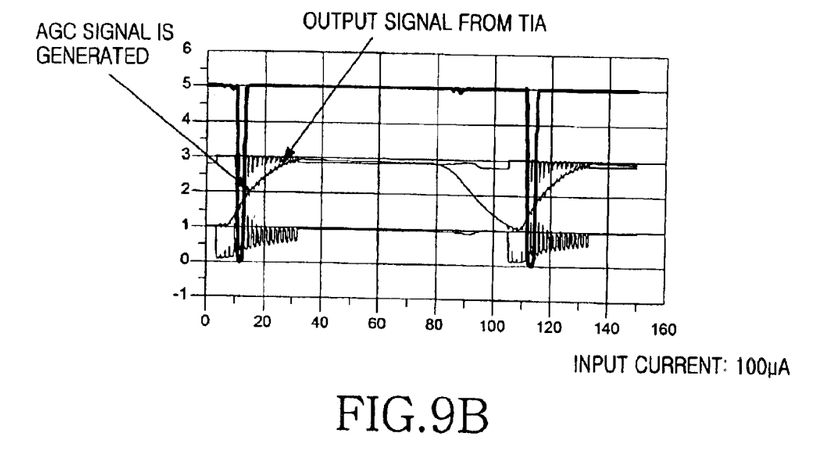

FIGS. 9a and 9b show that an AGC signal is not generated at a low-level input current, and that an AGC signal is generated when the input current is raised to a sufficient level. In particular, FIG. 9a shows a case when an input current is 10 µA, and FIG. 9b shows the generation of an AGC signal when an input current is 100 µA.

Accordingly, the automatic gain controller according to the present invention can rapidly respond between packets in a burst-mode operation and correctly determine the presence of a signal. In addition, the automatic gain controller can greatly reduce the AGC loop time (to tens of nsec at the longest).

While the invention has been shown and described with reference to a certain preferred embodiment thereof, it will be understood by those skilled in the art that various changes in form and details may be made therein without departing from the spirit and scope of the invention as defined by the appended claims. Therefore, the present invention is not to be unduly limited to the embodiment set forth herein, but to be defined by the appended claims and equivalents thereof.

What is claimed is:

1. An automatic-gain-control device used in an optical receiver, comprising:

a pre-amplifier for converting an input current signal to a corresponding voltage signal;

a bottom signal-level detector for generating a signal indicative of the presence of a signal output from the preamplifier and a reset signal for initialization of intervals between packets; and, an automatic gain controller for providing an automatic-gain-control signal in response to an output signal from the bottom signal-level detector, said automatic gain controller including a first transistor which turns on according to the output signal from said bottom signal-level detector and a second transistor coupled to a capacitor for charging or discharging a voltage applied by said first transistor, wherein a drain voltage of said second transistor becomes low when said capacitor is charged but becomes high when said capacitor is discharged.

2. The automatic-gain-control device according to claim 1, wherein said automatic gain controller begins to operate when an output signal begins to be distorted during an amplification process by said pre-amplifier.

3. The automatic-gain-control device according to claim 1, further comprising a third transistor coupled to said second transistor of said automatic gain controller for discharging when the drain voltage is high in order to reset the automatic-gain-control signal.

4. The automatic-gain-control device according to claim 1, further comprising a buffer coupled to the output of the pre-amplifier.

5. The automatic-gain-control device according to claim 1, further comprising an optical detector coupled to an input of the preamplifier for detecting an optical signal.

6. The automatic-gain-control device according to claim 1, wherein said preamplifier is a trans-impedance amplifier.

7. The automatic-gain-control device according to claim 1, wherein said first transistor and said second transistor are coupled to a first resistor and a second resistor, respectively, wherein gain and bandwidth of the preamplifier is dependent on said first and second resistors.

* * * * *